United States Patent [19]

Houston

[11] Patent Number: 5,210,715
[45] Date of Patent: May 11, 1993

[54] MEMORY CIRCUIT WITH EXTENDED VALID DATA OUTPUT TIME

[75] Inventor: Theodore W. Houston, Richardson, Tex.

[73] Assignee: Texas Instruments Incorporated, Dallas, Tex.

[21] Appl. No.: 573,598

[22] Filed: Aug. 27, 1990

Related U.S. Application Data

[63] Continuation of Ser. No. 211,619, Jun. 27, 1988, Pat. No. 4,953,130.

[51] Int. Cl.⁵ .................................................. G11C 7/00
[52] U.S. Cl. .............................. 365/194; 365/189.05; 307/594; 307/265; 307/597; 307/601; 307/603
[58] Field of Search ............... 307/443, 481, 594, 265, 307/597, 601, 603, 279, 479; 365/189.05, 194, 203, 233.5

[56] References Cited

U.S. PATENT DOCUMENTS 4,764,900  8/1988  Bader et al. ............... 365/189.05
4,820,942  4/1989  Chan ............................ 307/279

Primary Examiner—Joseph E. Clawson, Jr.
Attorney, Agent, or Firm—Stanton C. Braden; Richard L. Donaldson; William E. Hiller

[57] ABSTRACT

A memory device (10) having an asymmetrical delay circuit (34) in a data output path of the memory device (10) is disclosed. The memory device (10) employs a precharge circuit (28) to impress a precharge state in a read memory access cycle. The asymmetrical delay circuit (34) imposes a relatively slow propagation delay on data signals which transition toward this precharge state, but imposes a relatively fast propagation delay on data signals which transition away from this precharge state. Specific embodiments of an output portion (32) of the memory device (10) are presented to accommodate a high impedance state in an output buffer (38) during signal transitions and to accommodate various polarity precharge states.

1 Claim, 2 Drawing Sheets

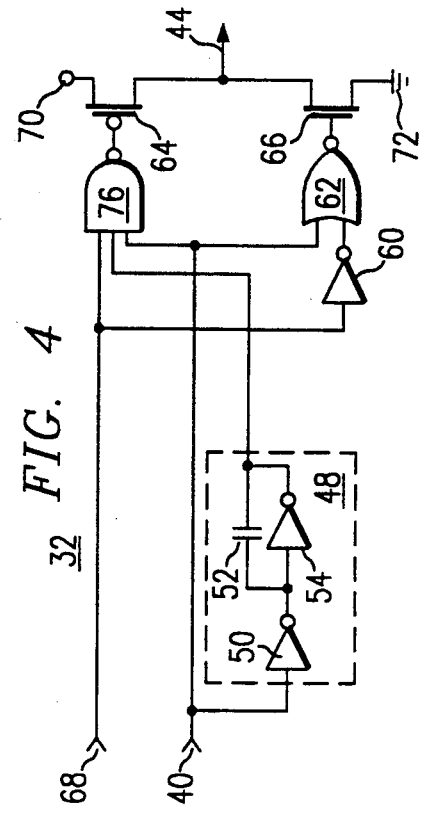
FIG. 4
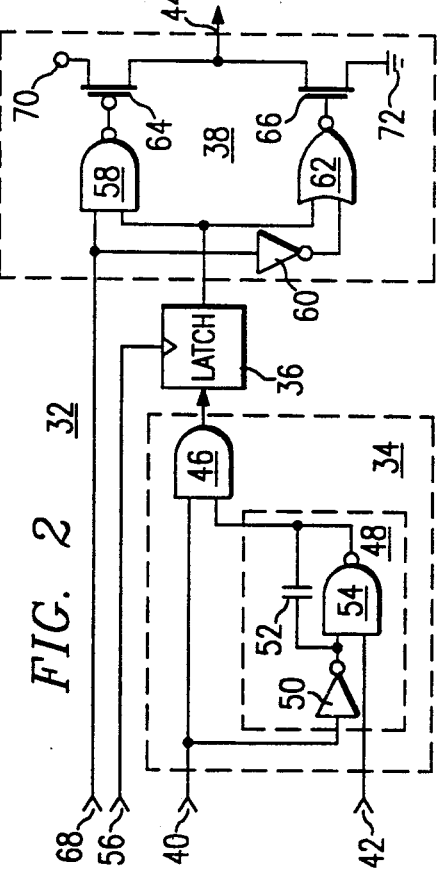
FIG. 2
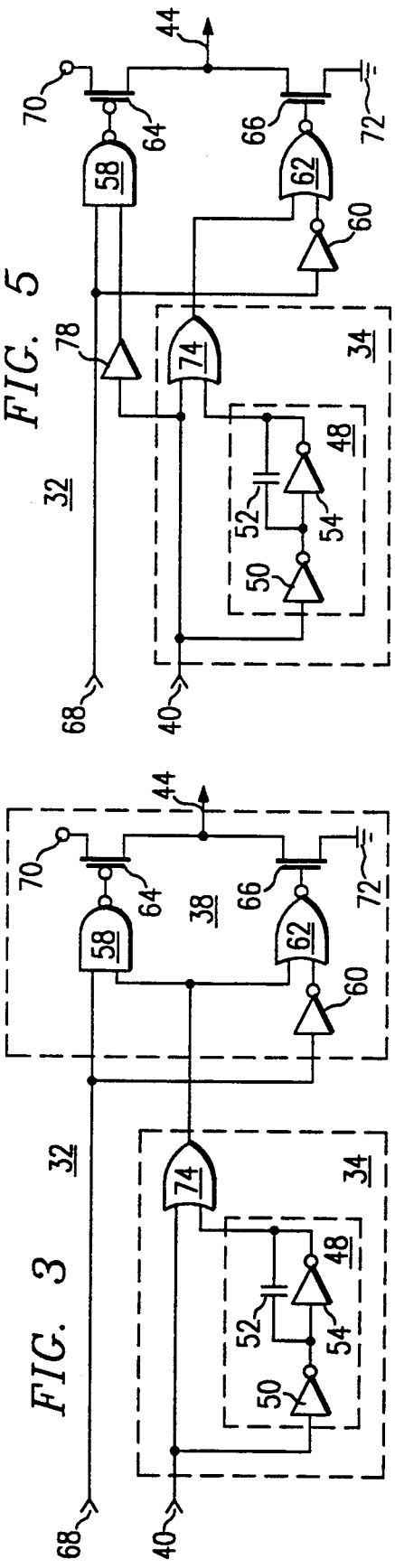
FIG. 5
FIG. 3

MEMORY CIRCUIT WITH EXTENDED VALID DATA OUTPUT TIME

This is a continuation of application Ser. No. 07/211,619 filed Jun. 27, 1988 now U.S. Pat. No. 4,953,130.

TECHNICAL FIELD OF THE INVENTION

The present invention relates generally to semiconductor memory devices. More specifically, the present invention relates to circuits employed in connection with such memory devices.

BACKGROUND OF THE INVENTION

In the design of semiconductor memory devices, attention is continually given to simplifying circuits utilized in connection with such devices. Simplified circuits typically require less space, consume less power, and operate more reliably than more complicated circuits. However, as the speed at which such memory devices operate increases, complexity of circuit designs used in connection with such devices tends to increase.

For example, in a typical semiconductor memory device, such as an SRAM, DRAM, PROM, EPROM, or the like, a change in an address supplied to the device causes data previously output from the device to become invalid after some typically short specified period of time. When the device is being operated at maximum speed, the address changes as soon as the output data becomes valid. Consequently, data remains valid at the device output for only a short period of time. The device is difficult to utilize when operated at maximum speed because the data output does not remain valid for an acceptably long period of time. Moreover, as device speed increases, a precharge portion of an access cycle tends to occur more quickly after an address change, and this rapid precharge tends to further decrease valid data output time.

One solution to this shrinking valid data output time problem has been to incorporate a latch in a memory device. However, the timing and control circuitry used in connection with such a latch tends to be undesirably complicated. The complication arises due to a very critical timing requirement in capturing valid data and to a very critical timing requirement in connection with releasing data so that a subsequent access cycle will not be delayed by operation of the latch.

In addition, many semiconductor memory devices tolerate a certain amount of crowbar current in connection with data transitions at output buffers of the memory devices. Crowbar current represents a current surge which flows between power rails through the output buffer. It typically results from momentary, simultaneous activation of two, series connected active devices located between the power rails. These current surges are undesirable because they cause excess power consumption and because they produce voltage surges within the memory device. As memory device speed increases, internal circuitry tends to become more susceptible to the undesirable effects of such voltage surges. Consequently, circuit complexity tends to increase to ensure that such surges are minimized and to ensure that such surges do not adversely affect the circuits.

One solution to the crowbar current problem has been to utilize differences in rise and fall times of the circuits driving the active devices to deactivate one of the two active devices a very short amount of time before beginning to activate the second of the two active devices. However, this solution is undesirable because the insubstantial timing difference tends not to significantly reduce crowbar currents, and because these relative activation and deactivation rates can reverse in the presence of radiation or at extreme temperatures.

Consequently, a need exists for a simple circuit which addresses the valid output data time and crowbar current problems.

SUMMARY OF THE INVENTION

Accordingly, it is an advantage of the present invention that an improved memory device is provided which incorporates a circuit to extend the length of time for which output data remains valid.

Another advantage of the present invention is that a circuit is provided which resides in a data path of a memory device and does not require generation of timing signals for its operation.

The above and other advantages of the present invention are carried out in one form by a memory device in which a precharge portion of a read access cycle causes an output of the memory device to exhibit data in a first logical state. The memory device includes a first structure which delays transition of data at the memory device output from the first logical state to a second logical state. In addition, the memory device includes a structure which delays data at the memory device output when this data transitions from the second logical state to the first logical state. Moreover, the first structure and second structure are configured so that the data transitions from the first logical state to the second logical state substantially quicker than it transitions from the second logical state to the first logical state.

BRIEF DESCRIPTION OF THE DRAWINGS

A more complete understanding of the present invention may be derived by referring to the detailed description and claims when considered in connection with the FIGURES, wherein like reference numbers refer to similar items throughout the FIGURES, and:

FIG. 2 shows a logical diagram of a first embodiment of an output portion of the memory device shown in FIG. 1;

FIG. 3 shows a logical diagram of a second embodiment of the output portion of the memory device shown in FIG. 1;

FIG. 4 shows a logical diagram of a third embodiment of the output portion of the memory device shown in FIG. 1; and FIG. 5 shows a logical diagram of a fourth embodiment of the output portion of the memory device shown in FIG. 1.

DETAILED DESCRIPTION OF THE PREFERRED EMBODIMENTS

Figure 1:
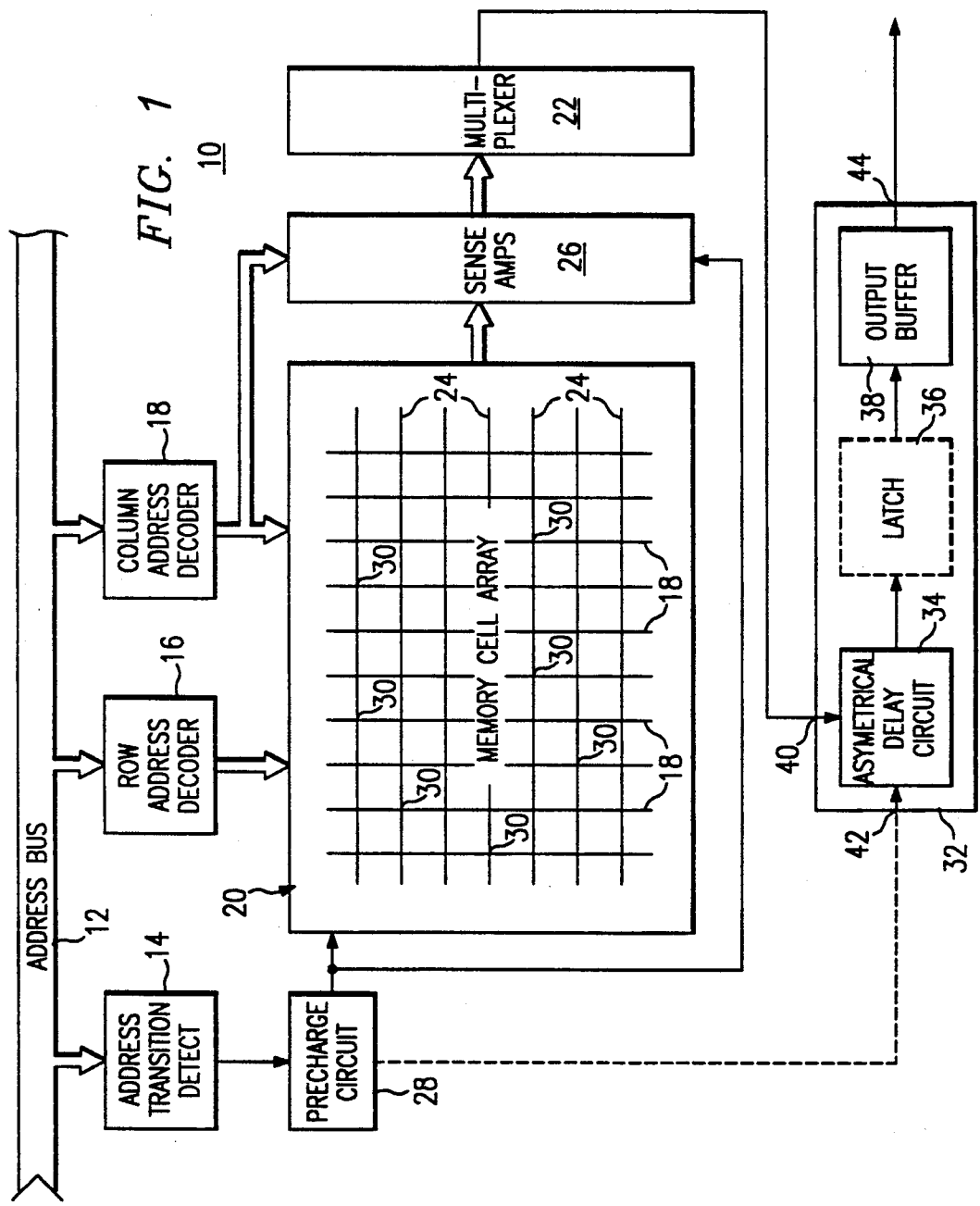
FIG. 1 shows a block diagram of a memory device constructed in accordance with the present invention.

FIG. 1 shows a simplified block diagram of a memory device 10 constructed in accordance with the present invention. Memory device 10 may represent an SRAM, DRAM, PROM, EPROM, or other semiconductor memory device. In FIG. 1, memory device 10 receives an address bus 12, which couples to an address transition detection circuit 14. In addition, a row address portion of address bus 12, couples to a row address decoder 16, and a column address portion of address bus 12 couples to a column address decoder 18. Outputs from row address decoder 16 couple to word lines 18 of a memory cell array 20. In addition, outputs from column address decoder 18 couple to memory cell array 20 and to selection inputs of a multiplexer 22. Bit lines 24 of memory cell array 20 couple to inputs of sense amplifiers 26, and outputs of sense amplifiers 26 couple to inputs of multiplexer 22. An output from address transition detection circuit 14 couples to an input of a precharge circuit 28, and outputs of precharge circuit 28 couple to bit lines 24 of memory cell array 20 and to sense amplifiers 26.

Memory cell array 20 contains a multiplicity of semiconductor memory cells 30. Each of memory cells 30 is located at an intersection between a word line 18 and a bit line 24. Thus, memory cells 30 are arranged in an array of rows and columns. Each of cells 30 is intended to store one bit of data when memory device 10 represents a one bit wide memory device or more bits of data if memory device 10 represents a memory device which saves more than one bit of data at each address. A particular one of memory cells 30 is selected by an address value supplied on address bus 12 and decoded by row address decoder 16 and column address decoder 18. In the preferred embodiment, row address decoder 16, column address decoder 18, and memory cell array 20 represent conventional memory structures which may advantageously be implemented in a conventional fashion.

Address transition detection circuit 14 monitors each bit of an address value presented on address bus 12 to detect when this address value changes. The output signal from address transition detection circuit 14 indicates when one of these address bits changes logical states. When this event occurs, the output signal from address transition detection circuit 14 commands precharge circuit 28 to introduce a predetermined voltage level on each of bit lines 24 of memory cell array 20. In addition, the preferred embodiment of the present invention supplies a precharge signal to sense amps 26. The predetermined voltage established on bit lines 24 may then be influenced by the programming of cells 30 in memory array 20. Specifically, cells 30 residing on a word line 18 which is specified by the row address portion of address bus 12 may force corresponding bit lines 24 to a state which would cause an output opposite to that caused by the precharge state, depending upon the programming of such cells. Sense amps 26 detect voltages on bit lines 24, and multiplexer 22 selects a particular column, or bit line 24 as a source of data output from memory device 10. In the preferred embodiment of the present invention, address detection circuit 14, precharge circuit 28, sense amps 26, and multiplexer 22 represent conventional structures in the fabrication of memory devices, and conventional implementations for these structures are contemplated by the present invention.

An output from multiplexer 22 drives an output portion 32 of memory device 10. Output portion 32 includes an asymmetrical delay circuit 34, an optional latch 36 (shown in dotted lines), and an output buffer 38. Specifically, the output of multiplexer 22 couples to an input of asymmetrical delay circuit 34 at an input node 40 thereof. Moreover, an output of precharge circuit 28 couples to an optional input (shown as a dotted line) of asymmetrical delay circuit 34 at a node 42. An output of asymmetrical delay circuit 34 couples to an input of latch 36, and an output of latch 36 couples to an input of output buffer 38. An output of output buffer 38 couples to a node 44, which serves as the output from memory device 10 and provides data recalled from memory device 10.

Asymmetrical delay circuit 34 delays data signals propagating therethrough. More specifically, asymmetrical delay circuit 34 delays signals which transition from a first logical state to a second logical state a different period of time than it delays signals which transition from the second logical state to the first logical state. For example, if the precharge state impressed on bit lines 24 by precharge circuit 28, uninfluenced by programming of memory cells 30, causes a logical 1 to appear at node 40, then asymmetrical delay circuit 34 introduces a relatively slow delay in propagating a transition of this signal to a logical 1 at the output of asymmetrical delay circuit 34. On the other hand, in this situation asymmetrical delay circuit 34 introduces a relatively fast propagation delay on signals transitioning from a logical 1 to a logical 0 at node 40.

Latch 36 represents an optional structure which is conventional memory device designs. Latch 36 may serve to hold output data even longer than occurs through the operation of asymmetrical delay circuit 34. However, the timing and control considerations for latch 36 are not critical because asymmetrical delay circuit 34 tends to extend the time for which data recalled from memory cell array 20 remains valid at the output of asymmetrical delay circuit 34.

Output buffer 38 includes logic circuitry to control a high impedance output state of memory device 10 so that multiple memory devices may be coupled together at the outputs thereof. In addition, output buffer 38 provides sufficient drive capability to interface memory device 10 to inputs of other devices (not shown).

Table 1, shown below, presents all possible data transitions which may occur between two successive read memory access cycles. Data output from memory device 10 during these two access cycles are listed in the "Last Output" and "Next Output" columns of Table 1. In addition, data presented in the "Precharge" column of Table 1 defines the precharge state of data at output node 44. Cases 1-4 illustrate the operation of memory device 10 when the precharge state produces a logical 1 at output node 44, and cases 5-8 illustrate the operation of memory device 10 when the precharge state produces a logical 0 at output node 44. In the preferred embodiment, memory device 10 is designed to operate either only in connection with cases 1-4 or only in connection with cases 5-8. In other words, the precharge state shown in TABLE 1 results from the design of memory device 10, and does not change due to the operation of memory device 10.

TABLE 1

|  | Last Output | Precharge | Next Output |
|---|---|---|---|
| Case 1: | 0 | 1 | 0 |
| Case 2: | 0 | 1 | 1 |
| Case 3: | 1 | 1 | 0 |
| Case 4: | 1 | 1 | 1 |
| Case 5: | 0 | 0 | 0 |
| Case 6: | 0 | 0 | 1 |
| Case 7: | 1 | 0 | 0 |
| Case 8: | 1 | 0 | 1 |

In a typical sequence of events occurring in connection with two successive read access cycles of memory device 10, memory device 10 outputs a Last Output value shown in Table 1. Then, as a change in address is detected at address transition detection circuit 14, a Precharge value is output from memory device 10. Finally, after the precharge state has been established, a Next Output value becomes valid, presenting data specified by the new address value.

In cases 1–4 of Table 1, asymmetrical delay circuit 34 imposes a slower delay on data changing from a logical 0 state to a logical 1 state than it imposes on data changing from a logical 1 state to a logical 0 state. Consequently, the Last Output value in cases 1 and 2 remains valid for a relatively long period of time before the output exhibits the Precharge state. In cases 3 and 4, asymmetrical delay circuit 34 has substantially no effect because the output data does not change logical states. On the other hand, since asymmetrical delay circuit 34 imposes only a minimal delay on data transitioning from a logical 1 to a logical 0 state, the Next Output in cases 1 and 3 is not significantly delayed. Moreover, no delay occurs in cases 2 and 4 because the Next Output does not change states from the Precharge state.

Cases 5–8 of Table 1 occur when the Precharge condition produces a logical 0 at output 44. Thus, for cases 5–8 asymmetrical delay circuit 34 delays data transitions from a logical 1 state to a logical 0 state more than it delays data transitions from a logical 0 state to a logical 1 state. In case 5, no data transitions occur, so the Last Output remains valid through the Precharge time period. Likewise, in case 6, the Last Output is a logical 0 value and it remains valid through the Precharge period. However, in cases 7 and 8, asymmetrical delay circuit 34 causes a relatively slow transition from a logical 1 Last Output value to a logical 0 Precharge state. This extends the time for which output data remains valid. In cases 5 and 7, no data transitions occur from the precharge state to the Next Output. Therefore, asymmetrical delay circuit 34 does not delay the subsequent read access cycle. Moreover, in cases 6 and 8, asymmetrical delay circuit 34 imposes only an insubstantial delay in transitioning from a logical 0 Precharge state to a logical 1 Next Output value.

In the preferred embodiment of the present invention, the longer one of the delay periods produced by asymmetrical delay circuit 34 approximately equals the amount of time required for the precharge state. However, there is no requirement that this delay has any specific relationship to the precharge time so long as it remains less than the entire memory read access cycle. On the other hand, the faster of the two delays imposed by asymmetrical delay circuit 34 represents only an insubstantial propagation delay which may be as little as one fourth the precharge time or less.

Output portion 32 of memory device 10 is discussed in more detail in FIGS. 2–5. Specifically, FIGS. 2 and 3 show first and second embodiments of output portion 32 for use in cases 1–4 and 5–8, respectively, of Table 1. Likewise, FIGS. 4 and 5 show third and fourth embodiments of output portion 32 for use in cases 1–4 and 5–8, respectively.

Referring to FIG. 2, asymmetrical delay circuit 34 includes an AND element 46 and a delay element 48. A first input of AND element 46 couples to node 40, and a second input of AND element 46 couples to an output of delay element 48. Delay element 48 includes an inverter 50, a capacitor 52, and a NAND element 54. An input of inverter 50 serves as the input to delay element 48 and couples to node 40. An output of inverter 50 couples to a first node of capacitor 52 and to a first input of NAND element 54. A second input of NAND element 54 serves as a control input to delay element 48 and couples to node 42. An output of NAND element 54 couples to a second node of capacitor 52 and serves as the output of delay element 48.

Although a specific implementation is shown for delay element 48, the present invention contemplates the use of any delay element known to those skilled in the art for delay element 48. As discussed above in connection with FIG. 1, the present invention contemplates that delay element 48 should insert a delay approximately equal to the length of the precharge state for memory device 10. However, this delay value is not critical and need not be specifically related to the length of the precharge state. On the other hand, the length of this delay is anticipated to be substantially longer than propagation delays associated with AND element 46 or latch 36.

The output of asymmetrical delay circuit 34 couples to a data input of latch 36, and a data output of latch 36 couples to a data input of output buffer 38. A clock input of latch 36 couples to a node 56, which supplies a signal that controls the latching of data in latch 36. The timing of this signal is not critical in the present invention due to the use of asymmetrical delay circuit 34 prior to latch 36.

Output buffer 38 includes a NAND element 58, an inverter 60, and a NOR element 62. In addition, output buffer 38 includes a P channel field effect transistor (FET) 64 and an N channel FET 66. A first input of NAND element 58 couples to a first input of NOR element 62, and these first inputs serve as the data input to output buffer 38. A node 68 couples to a second input of NAND element 58 and to an input of inverter 60. An output of inverter 60 couples to a second input of NOR element 62. An output of NAND element 58 couples to a control input, or gate, of FET 64, and an output of NOR element 62 couples to a control input, or gate, of FET 66. An input, or source, of FET 64 couples to a terminal 70, which is adapted to receive a positive voltage. An input, or source, of FET 66 couples to a terminal 72, which is adapted to receive a ground or negative potential with reference to the potential applied at terminal 70. Output nodes, or drains, of FETS 64 and 66 couple together and to node 44 to provide data output from memory device 10 (see FIG. 1). The present invention contemplates implementing the logic elements shown in FIG. 2 using conventional techniques and the inclusion of additional conventional stages (not shown) for buffering to increase drive capabilities to FETS 64 and 66.

The signal supplied at node 42 enables and disables delay element 48. The signal supplied at node 42 exhibits a logical 1 when a read access cycle occurs in which the precharge mode is utilized. However, memory device 10 contemplates permitting the occurrence of read access cycles in certain situations without a prior precharge cycle. In such situations, the signal supplied at node 42 exhibits a logical 0, and delay element 48 is disabled. When delay element 48 is disabled, asymmetrical delay circuit 34 provides approximately equal delays for 0 to 1 on 1 to 0 transitions.

in FIG. 2, the output of asymmetrical delay circuit 34 exhibits a logical 1 only after both a data signal presented at node 40 and a delayed signal presented at the output of delay element 48 each exhibit a logical 1. Consequently, transitions of data from a logical 0 to a logical 1 occur relatively slowly because the period of time associated with delay element 48 must first transpire before the output of AND element 46 can transition to a logical 1 value. On the other hand, when the data presented at node 40 transitions from a logical 1 to a logical 0, the output of asymmetrical delay circuit 34 likewise exhibits a logical 0 after only a propagation delay associated with AND element 46. Delay element 48 has no influence on this 1 to 0 transition.

The signal supplied at node 68 and logical elements 58-62 together serve to enable and disable FETS 64 and 66. When this signal is a logical 0, each of FETS 64 and 66 is disabled, and output node 44 exhibits a high impedance. However, when this signal is a logical 1, output buffer 38 is enabled, and the output presented at node 44 reflects a data state provided at the output of latch 36. Specifically, if the output data at latch 36 is a logical 1, then FET 64 is activated, FET 66 is deactivated, and output node 44 exhibits a logical 1. On the other hand, if the data output from latch 36 is a logical 0, then FET 64 is deactivated, FET 66 is activated, and output node 44 exhibits a logical 0.

FIG. 3 shows a logical diagram of a second embodiment of output portion 32 of memory device 10 (see FIG. 1) The second embodiment shown in FIG. 3 may advantageously be used when the precharge state causes the data value at node 40 to exhibit a logical 0, or for cases 5-8 discussed above in connection with Table 1. The logical diagram shown in FIG. 3 is similar to the logical diagram discussed above in connection with FIGURE 2, and the discussion presented therewith applies to the FIG. 3 structure as well. However, the FIG. 3 logical diagram differs from that discussed above in connection with FIG. 2 in that optional latch 36 has not been included in the FIG. 3 structure, the optional disabling function presented at node 42 of FIG. 2 has not been included in the FIG. 3 structure, and AND element 46 (see FIG. 2) has been replaced with an OR element 74 in the FIG. 3 structure. One input of OR element 74 couples to input node 40, and a second input of logical OR element 74 couples to the output of delay element 48. An output of logical OR element 74 couples to the data input of output buffer 38.

Consequently, asymmetrical delay circuit 34 inserts a relatively slow propagation delay when a data value presented at input node 40 transitions from a logical 1 to a logical 0 but inserts a relatively fast propagation delay when this data transitions from a logical 0 to a logical 1. Only when both the data value presented at node 40 and the output signal from delay element 48 equal a logical 0 will the output from asymmetrical delay circuit 34 exhibit a logical 0. The time delay associated with delay element 48 must first transpire before both exhibit a logical 0. However, when a data transition to a logical 1 is applied at node 40, an output from asymmetrical delay circuit 34 exhibits a logical 1 after only a propagation delay associated with OR element 74. This asymmetrical delay is reflected in the output signal provided at node 44 of output buffer 38 in a similar manner to that described above in connection with FIG. 2.

The first and second embodiments of output portion 32 shown in FIGS. 2 and 3 may cause a crowbar current to flow through FETS 64 and 66 as a signal presented at output 44 transitions from one logical state to another. This crowbar current occurs when both of FETS 64 and 66 are fully or partially activated at any instant in time. However, the data signal presented to output buffer 38 in FIGS. 2 and 3 from asymmetrical delay circuit 34 switches signals at control nodes of FET 64 and 66 at approximately the same point in time. Thus, this crowbar current is minimized. Nevertheless, the third and fourth embodiments of output portion 32 of memory device 10 (see FIG. 1) which are presented in FIGS. 4 and 5, respectively, utilize asymmetrical delay circuit 34 to guarantee that one of FETS 64 and 66 is deactivated prior to the activation of the other of FETS 64 and 66.

Specifically, FIG. 4 shows a logical diagram of a third embodiment of output portion 32. This third embodiment may be used when the precharge state presents a logical 1 at node 40. The FIG. 4 structure is also similar to the FIG. 2 structure. However, the FIG. 4 structure differs from the FIG. 2 structure in that optional latch 36 has been omitted, and the optional disabling of delay element 48 has been omitted. Moreover, the logical function performed by two input AND element 46 and two input NAND element 58 in FIG. 2 has been combined into a single three input NAND element 76 in FIG. 4. Thus, the asymmetrical delay function in the FIG. 4 structure occurs through operation of delay element 48 and NAND element 76.

Moreover, this asymmetrical delay function influences only P channel FET 64 and not N channel FET 66. N channel FET 66 is influenced only from data supplied directly at input node 40. As a result, a logical 0 to logical 1 transition of data presented at input node 40 causes FET 66 to quickly deactivate. This deactivation occurs after only a propagation delay through NOR element 62. On the other hand, this logical 0 to logical 1 transition of data at input node 40 causes FET 64 to activate only after a delay which is imposed by delay element 48. As a result, output 44 exhibits a high impedance state for a length of time roughly equivalent to the delay imposed by delay element 48. In circuits using memory device 10 (see FIG. 1), capacitance associated with output node 44 and devices coupled thereto (not shown) tends to hold a logical 0 data value at output node 44 for this length of delay. Moreover, no crowbar current flow through FETS 64 and 66. This structure is especially adaptable for use in connection with driving CMOS devices with output node 44 and for driving conventional TTL type inputs from output node 44 when the delay imposed by delay element 48 is sufficiently short.

On the other hand, when data at input node 40 transitions from a logical 1 to a logical 0, FET 64 deactivates simultaneously with the activation of FET 66. Thus, no substantial delay is imposed, and valid data from a successive read access cycle of memory device 10 (see FIG. 1) may be presented at output node 44 as soon as possible.

FIG. 5 shows a logic diagram of a fourth embodiment of output portion 32 of memory device 10 (see FIG. 1). This fourth embodiment is intended to be used when the precharge state presents a logical 0 at node 40. The structure shown in FIG. 5 closely resembles the structure shown in FIG. 3, except that asymmetrical delay circuit 34 drives only N channel FET 66 and not P channel FET 64. In addition, a buffer 78 resides in series with the first input of NAND element 58, and the input of buffer 78 couples to input node 40. Input buffer 78 merely inserts a propagation delay so that logical 0 to logical 1 data transitions at input node 40 influence control nodes of FETS 64 and 66 at substantially identical points in time. On the other hand, the operation of asymmetrical delay circuit 34 causes a logical 1 to logical 0 transition of data presented at input node 40 to first deactivate P channel FET 64 then wait an amount of time controlled by the delay of delay element 48 before activating N channel FET 66. Consequently, output node 44 exhibits a high impedance state for this length of delay, and crowbar current is prevented.

In summary, the present invention provides an improved memory device 10 which incorporates asymmetrical delay circuit 34 to extend the length of time for which output data from memory device 10 remains valid. In addition, asymmetrical delay circuit 34 resides in the data path from memory cell array 20 (see FIG. 1) to output 44 of memory device 10 and does not require circuitry to generate complicated timing and control signals. The use of asymmetrical delay circuit 34 may extend the valid output data time sufficiently long so that a latch, such as latch 36, is not required in many applications. Moreover, even applications which require the use of latch 36 benefit from the use of asymmetrical delay circuit 34 because timing and control signals which operate latch 36 may be simplified due to the extended valid output data time. Still further, the present invention contemplates the use of various embodiments of output portion 32 of memory device 10 to accommodate various polarities of data produced by the precharge state and to further reduce crowbar current.

The foregoing description discusses preferred embodiments of the present invention, which may be changed or modified without departing from the scope of the present invention. For example, the P channel FETS discussed above may be replaced with N channel FETS in some applications, and appropriate polarity changes in controlling signals are required. Moreover, the N channel and P channel FETS discussed above generally represent active devices which may be replaced with bipolar or other technology active devices. Still further, those skilled in the art Will understand that the logical elements described above may be formed using a wide variety of logical gates employing any polarity of input or output signals, and that the logical values described above may be implemented using different voltage polarities. As an example, an AND element may be formed using an AND gate or a NAND gate when all input signals employ a positive logic convention, or it may be formed using an OR gate or a NOR gate when all input signals exhibit a negative logic convention. These and other changes and modifications are intended to be included within the scope of the present invention.

What is claimed is:

1. An output buffer including an asymmetrical delay circuit, said buffer being operable such that said buffer responds slower to input transitions from a first state to a second state than said buffer responds to input transitions from said second state to said first state.

* * * * *